United States Patent [19]

Pryor

[11] Patent Number: 4,623,911
[45] Date of Patent: Nov. 18, 1986

[54] HIGH CIRCUIT DENSITY ICS

[75] Inventor: Richard L. Pryor, Voorhees Township, Camden County, N.J.

[73] Assignee: RCA Corporation, Princeton, N.J.

[21] Appl. No.: 562,245

[22] Filed: Dec. 16, 1983

[51] Int. Cl.[4] .............................................. H01L 29/78
[52] U.S. Cl. ....................................... 357/45; 357/40; 357/41; 357/42; 357/48; 357/68; 357/71
[58] Field of Search ........................ 357/71, 68, 45, 40, 357/41, 42, 48

[56] References Cited

U.S. PATENT DOCUMENTS

| T100,501 | 4/1981 | Balyoz et al. | 357/45 |
|---|---|---|---|
| T101,804 | 5/1982 | Balyoz et al. | 357/45 |
| 3,999,214 | 12/1976 | Cass | 357/48 |
| 4,249,193 | 2/1981 | Balyoz et al. | 357/68 |
| 4,295,149 | 10/1981 | Balyoz et al. | 357/45 |
| 4,412,237 | 10/1983 | Matsumura et al. | 357/41 |
| 4,500,906 | 2/1985 | Ohno et al. | 357/45 |
| 4,511,914 | 4/1985 | Remedi et al. | 357/45 |

OTHER PUBLICATIONS

I. Ohkura, et al., "Gate Isolation—A Novel Basic Cell Configuration for CMOS Gate Arrays", *Proceedings of the 1982 Custom Integrated Circuits Conference*, May 17-19, 1982, pp. 307-310.

Primary Examiner—Andrew J. James
Assistant Examiner—Charles S. Small, Jr.
Attorney, Agent, or Firm—Joseph S. Tripoli; Robert L. Troike; Robert Ochis

[57] ABSTRACT

An IC having closely packed rows of cells enables both regular structures (register stacks and memories) and random logic structures to be efficiently fabricated from it. Circuits having more parallel-to-the-length-of-the-rows interconnecting wiring than regular structures have wiring corridors over inactive rows of cells whose cells are not connected into the circuit. A grid power bus structure smooths power flow with a minimum of active device loss by hyphenating "large" cells across the cell-row-crossing conductors.

9 Claims, 7 Drawing Figures

HIGH CIRCUIT DENSITY ICS

The Government has rights in this invention pursuant to Contract No. DAAK20-82-C-0397, awarded by the Department of the Army.

The present invention relates to the field of integrated circuits (ICs) and more particularly to automatic universal arrays and other ICs in which the same transistor configuration or array is interconnected by "customized" wiring to produce different ICs having different logic functions. This invention also relates to ICs which are constructed with "standard cells".

A universal array IC structure (also known as an uncommitted logic array or gate array) comprises a predefined, fixed pattern of active devices. These active devices are usually transistors. These transistors have fixed locations and may be interconnected in different ways to provide "logic cells" which perform different logic functions. The transistors and thus the logic cells are usually arranged in parallel rows. When describing array structures these rows are normally oriented across the width of IC and referred to as being horizontal. These rows are spaced apart in a direction perpendicular to their length. This direction is referred to as vertical. The spacing of these rows is generally uniform. In CMOS type universal arrays, a cell row usually includes a row or line of PMOS transistors and an adjacent row or line of NMOS transistors. In this specification these individual transistor rows which extend parallel to the cell rows are called transistor lines to avoid confusion with the use of the term row for cell rows. These cell rows are separated by intervening wiring corridors which are dedicated for the routing of custom conductors which interconnect different cells or devices within a single cell. A common wiring corridor configuration includes a plurality of individual predefined wiring channels running horizontally (parallel to the length of the cell rows) and a plurality of individual wiring channels running vertically (perpendicular to the length of the cell rows). Each of the individual wiring channels is capable of containing a single conductor. The wiring corridor is designed so that horizontal and vertical conductors can cross either with or without a connection between them, in accordance with circuit needs.

The vertical width of the wiring corridors (and the number of horizontal wiring channels therein) is determined as a tradeoff between conflicting desires for (1) vertically narrow wiring corridors to enable many cell rows to be included in a universal array on a given size chip and (2) vertically wide wiring corridors which ensure that even very complex random logic circuits can be fabricated from that universal array. In this specification a "random logic circuit" means a logic circuit which is not a predictable repetition of a basic logic structure. Use of wiring corridors which are vertically wide enough to be adequate for the number of horizontal conductors required for even a relatively simple random logic circuit renders that universal array structure inefficient for the fabrication of circuits comprising a repetitious pattern of a single cell or structure, such as register stacks and memories. Because of the fixed location of the transistors in the array this inefficiency is inherent in that structure and exists whether or not random logic is actually included in an IC having such a repetitious pattern.

Logic cells vary in the number of transistors that are required for their implementation. A particularly simple cell such as a two input NAND gate may require only four transistors, a moderately complex cell such as an exclusive OR gate may require nine transistors and a complex cell such as a dual rank flip flop with set and reset may require twenty-four transistors. The logic design of an IC which is to be embodied in a universal array is normally done in terms of standard logic cells rather than the individual transistors which will be interconnected to provide its function.

An IC design which includes a power bus grid which contains power buses running parallel to the length of the cell rows and power buses running perpendicular to the length of the cell rows provides effective power distribution for many different patterns of power consumption within the IC. Where a power bus crosses a cell row a number of potential transistors are eliminated from the cell row. Where the number of available (unused) transistors adjacent a crossing-the-row power bus is less than the number included in a needed logic cell, that cell is not placed on that side of the power bus and those transistors remain unused. This decreases the efficiency with which a logic circuit can be embodied in that array. The waste of these transistors may, in marginal situations, make the difference between being able or unable to fabricate a given logic circuit in that array.

Provision of different universal arrays having different wiring corridor widths and power bus locations is not an attractive solution to this problem. This is in part because (a) a power bus spacing which wastes transistors in one row may waste none in the adjacent row and vice versa, (b) fixed costs (development, storage, distribution and so forth) are spread over fewer circuits and (c) a particular circuit which is to be embodied in an IC may have (1) a portion like a memory or a register stack which could be constructed in a compact, high-density structure, (2) a portion like complex random logic which requires a vast amount of wiring which could only be fabricated in a spread out, low density structure and (3) a portion which requires an intermediate amount of wiring which could be fabricated in a medium density structure. Thus, independent of what uniform basic universal array structure is used such a multidensity circuit can only be fabricated in an inefficient manner. Up to the present only custom design which allows each portion of the circuit to be fabricated with its own maximum possible density has provided an efficient structure for such a multidensity IC.

A universal array structure is needed which enables both random, low density, logic and regular, high density, structures to be fabricated in the same universal array in an area-efficient manner even with power buses which cross the cell rows.

The present invention overcomes the prior art tradeoff problem with respect to the width of wiring corridors by including dedicated wiring corridors containing four or fewer parallel-to-the-row wiring channels between adjacent transistor lines and by providing additional custom wiring channels as needed for a particular IC. The narrow dedicated wiring corridors enable efficient (high density) fabrication of regular structures such as register stacks and memories. The additional custom wiring channels, when needed, are located over inactive transistor lines in which the transistors are left unconnected and electrically insulated from any overlying conductors. A plurality of custom parallel-to-the-row wiring channels are defined over each of the inactive transistor lines. These custom wiring channels are populated with conductors as necessary for the interconnection of active transistors. Only those cell rows or parts of cell rows which are needed for custom wiring channels need to be rendered inactive and dedicated as custom wiring corridors. This enables each custom array circuit to be fabricated with near the maximum efficiency (density) to which its logic design is amenable. Thus, ICs in accordance with this invention can have densities approaching those of handcrafted custom designs.

Power distribution efficiency may be obtained by providing a rectangular grid of power buses. The tradeoff problem with respect to the location of such perpendicular-to-the-row power buses is overcome by hyphenation of cells across conductors which cross cell rows. Where the number of transistors on one side of a conductor (a power bus or signal line) which crosses a cell row is insufficient for fabrication of a given, needed logic cell, that cell may be hyphenated across that conductor and then includes transistors on both sides of that conductor. This avoids wasting available transistors because of conductors which cross the cell rows at locations which leave a number of otherwise available transistors on one side of the row-crossing conductor which is insufficient for fabrication of a needed cell.

Figure 1:
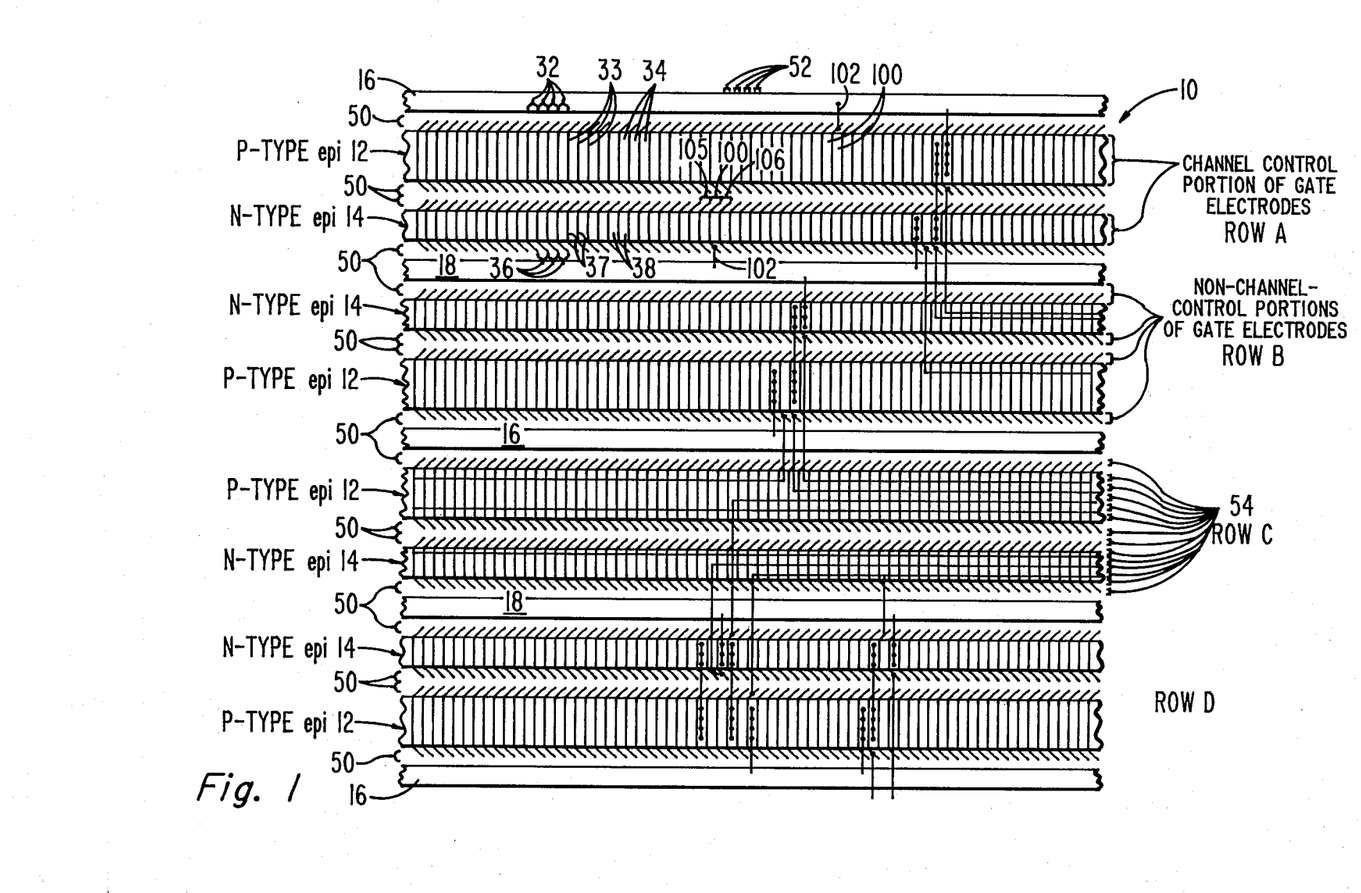
FIG. 1 illustrates a first IC structure in accordance with the invention.

A portion of the central (parallel rows) part of a CMOS-SOS IC 10 is illustrated in FIG. 1. This IC has a pattern of transistors, power buses and signal conductors which is in accordance with one aspect of the present invention. The structure comprises a plurality of elongated, substantially rectangular, P-type, extrinsic silicon regions 12 and a plurality of elongated, substantially rectangular, N-type, extrinsic, silicon regions 14. In this CMOS-SOS embodiment, the extrinsic regions are epitaxially grown on an insulating (sapphire) substrate. In a bulk silicon device these regions may be formed by epitaxial deposition, diffusion or implantation. These elongated extrinsic regions have their long dimension oriented parallel to each other (and horizontal in FIG. 1).

The P-type and N-type regions are interspersed in the portion of the IC shown in FIG. 1 in the pattern P, N, N, P, P, N, N, P. This pattern is preferred because it enables the area devoted to power buses to be minimized. Other patterns such as P, N, P, N, P, N, ... could be used, but could adversely affect circuit density. An N-type region and its adjacent P-type region together comprise a cell row suitable for CMOS (complimentary MOS) circuitry. There are equal numbers of N-type and P-type regions. Adjacent P-type regions 12 are spaced apart by an intervening relatively positive ($V_{DD}$) power bus 16. Adjacent N-type regions 14 are spaced apart by an intervening relatively negative (ground) power bus 18.

Figure 2:
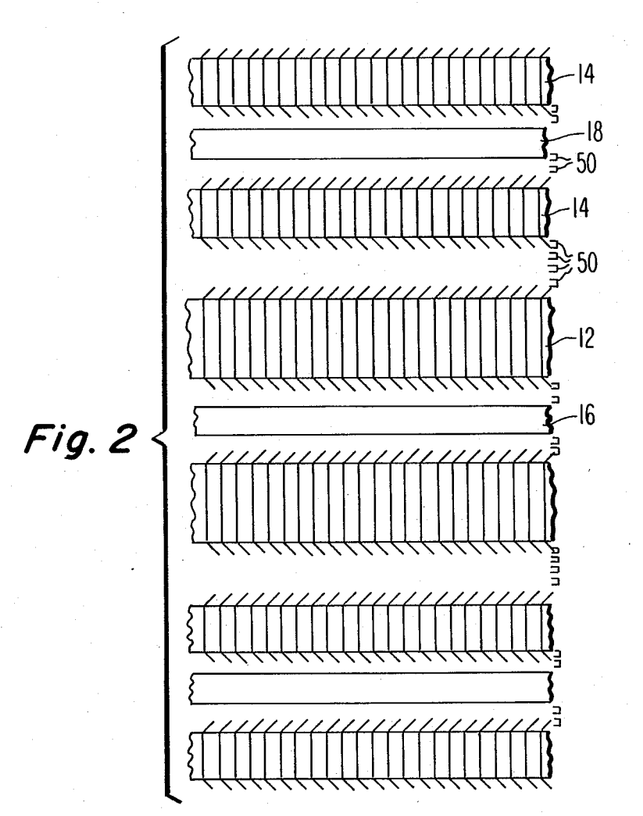
FIG. 2 illustrates a modified version of the FIG. 1 structure.

Preferably, only a single horizontal wiring channel 50 (i.e. capable of having a single conductor therein) is provided between each power bus (16 or 18) and each of its adjacent extrinsic regions (12 or 14), respectively. In FIG. 1 the position of the horizontal wiring channels is indicated at the lefthand edge of the parallel row structure. Preferably, only two horizontal wiring channels 50 are provided between each P-type region and its adjacent N-type region. Thus, between each set of adjacent extrinsic regions, there are two dedicated horizontal wiring channels available for custom conductors. Each of these wiring channels is disposed over the insulating substrate of the SOS structure as a means of minimizing capacitive coupling to the extrinsic regions. If desired, the number of these horizontal wiring channels can be increased somewhat—such as to four between adjacent extrinsic regions—by increasing the space between adjacent extrinsic regions as shown in FIG. 2. However, doing so can reduce the area efficiency of the array for regular structures.

Thus, the predefined horizontal wiring corridors whose location is defined in the invariant (non-customized) portion of this IC structure are too narrow to accommodate the amount of wiring needed for a random logic circuit. The significance of this structural difference from the prior art is discussed later.

A continuous series or line of uniform length (left to right in FIG. 1) PMOS transistors 32 is defined in each P-type region 12. These transistors have gate electrodes 33. The portion of the P-type extrinsic region 12 which is located between two adjacent gate electrodes 33 constitutes a shared source/drain region 34 which is the source of the transistor related to one of those gate electrodes and the drain of the transistor related to the other of those gate electrodes. The length of these transistors is equal to the spacing between two adjacent gate electrodes. A similar continuous series of NMOS transistors 36 having the same uniform length as the PMOS transistors is defined in each N-type region 14. These NMOS transistors have gate electrodes 37 and shared source/drain regions 38. The gate electrodes (33 and 37) are second direction aligned from line to line. This causes second direction alignment of the shared source/drain regions.

Each of the gate electrodes (33 or 37) has a channel-control portion over its associated P-type or N-type extrinsic region and a non-channel-control portion which extends beyond that region and over the region of the substrate where the horizontal wiring channels 50 are located adjacent to the opposing sides of that extrinsic region. This enables contact to be made between the gate electrode and a conductor in that horizontal wiring channel (via a custom contact hole through an intervening electrically insulating layer) without introducing increased capacitance between the gate electrode and the underlying extrinsic region.

A different vertical wiring channel 52 is located over each shared source/drain region (34 or 38) in each line and extends the full vertical (in FIG. 1) extent of the parallel rows structure. The location of a few of these wiring channels 52 is indicated at the top of FIG. 1. The non-channel-control portions of a gate electrode preferably include offset portions which extend into the vertical wiring channel 52 which is over one of the shared source/drain regions (34 or 38) of that transistor. In this way, a conductor located in a vertical wiring channel 52 (1) may have no connection to an underlying transistor, (2) may be connected to the gate electrode of that transistor, (3) may be connected to the aligned shared source/drain region of that transistor or (4) may be connected to both the gate electrode and the source/drain region. The offset portions of gate electrodes in this parallel-rows structure are preferably all offset in the same direction (e.g. to the right in FIG. 1). The transistor rows in FIG. 1 are packed about as closely together in the second direction as is feasible.

The omission of wide, predefined wiring corridors between rows of cells maximizes useable transistor density in the vertical (perpendicular to the length of the rows) direction in FIG. 1. This cell row layout pattern is amenable to very dense layout of circuitry such as register stacks and memories. However, unlike the prior art this does not render the array unuseable for lower density circuits. When more parallel-to-the-row wiring channels are needed than the number which are predefined in the non-customized (invariant) portion of the structure, a cell row (such as Row C in FIG. 1) is left inactive. That is, an N-type region and its adjacent P-type region are left with their transistors unconnected and insulated from overlying conductors by a layer of dielectric material. The area occupied by this inactive cell row is thereby made available as a horizontal wiring corridor since no intracell or intercell interconnection conductors interfere with the placement of custom horizontal or vertical wiring conductors in this area. This wiring corridor over an inactive cell row may have a capacity of 13 horizontal wiring channels 54 for the pattern as designed in FIG. 1. This wiring channel capacity depends on the center-to-center spacing of the horizontal wiring channels and the spacing between adjacent power buses 16 and 18. More than one inactive cell row may be custom dedicated to wiring channels between adjacent active cell rows if more horizontal signal wiring channels are needed (more than 13 in this example). When two or more cell rows are inactive and dedicated as wiring corridors, the power buses therebetween have no connection to active devices and may be replaced by one or more signal wiring channels.

Where the circuit configuration renders it appropriate, a portion of a cell row may be used for active devices while another, laterally displaced, portion of the same cell row may be rendered inactive and used as a wiring corridor as shown in Row B of FIG. 1. As a practical matter, there is a lower limit on the number of consecutive unconnected transistors which is adequate to allow useful horizontal signal wiring channels to be placed thereover. For these purposes, a transistor line portion is considered inactive if at least five consecutive transistors are not connected in the IC circuit. A cell row portion is considered inactive if both of its transistor lines are inactive therein; i.e. the transistor lines have second direction aligned inactive portions of at least five transistors each.

In prior art universal arrays each horizontally extending segment of the parallel row portion of the chip has a predefined use and is dedicated to that same use along its full length—either as a cell row or as a wiring corridor, but not both. Thus, in the prior art there is a lack of flexibility in the layout of active devices which limits the active device density across the entire parallel row structure in accordance with the maximum wiring needs (which occur near the horizontal center of the parallel-row structure). The present technique overcomes this limitation by allowing the dedication of semiconductor area to horizontal wiring corridors to be determined on the basis of actual local needs rather than on the basis of possible, presumed or even actual needs in some remote location. The placement of interconnecting wiring over inactive cell rows in accordance with the present invention carries a penalty of some increase in the capacitance of such conductors as compared to an SOS structure in which wiring channels are over substrate regions rather than semiconductor regions. However, this capacitance penalty is small compared with the resulting increase in IC density.

Where isolation is needed between two transistors, e.g. 105 and 106 in FIG. 1, in one of the continuous lines of transistors, an intervening transistor such as 100 is set permanently in the off condition. A custom conductor 102 in transistor 100's gate electrode vertical wiring corridor 52 connects the gate electrode of transistor 100 to the adjacent power bus ($V_{DD}$ bus for PMOS transistors and the ground bus for NMOS transistors). This holds transistor 100 off at all times. This replaces the technique of dedicating portions of the line to isolation by omitting the epitaxial silicon therefrom. In this way, only that isolation which is actually needed in the circuitry of an IC is provided. This increases the number of transistors which may be included in a line of a universal array. This allows the same or almost the same maximum number of active transistors to be present in a cell row as would be present if the cell row were custom designed from the substrate up using the same logic cells. Thus, maximum density is achieved in the horizontal direction in the FIG. 1 structure (for a given transistor size).

Figure 3:
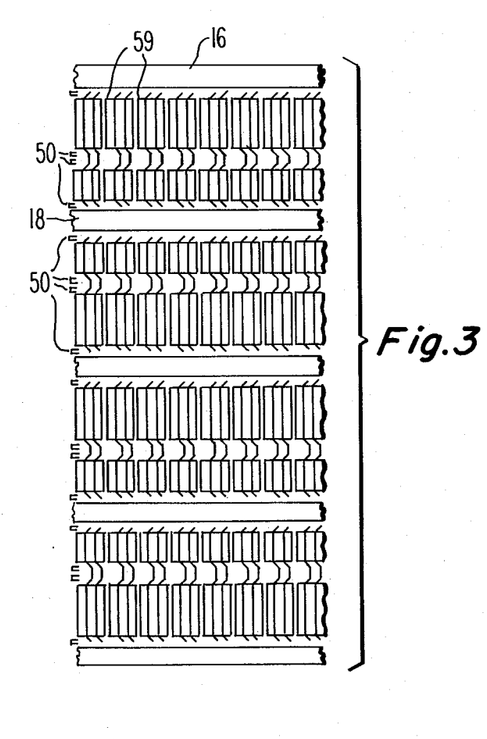
FIG. 3 illustrates an alternative structure in accordance with the present invention.

Together, continuous series of transistors and the provision of narrow, predefined wiring corridors combine to provide maximum flexibility and density in the utilization of the semiconductor area. The use of narrow, predefined wiring corridors is not restricted to use with cell rows having continuous epi regions. As is illustrated in FIG. 3, this technique is also useful with cell rows having built-in, predefined, isolation regions 59 between selected ones of the otherwise horizontally adjacent transistors in a cell row. However use of continuous epi is preferred because that aids in maximizing the number of functions which can be provided in a given area of parallel-row structure.

The present, inventive, universal array structure enables efficient fabrication of all types of logic circuitry—totally random logic, totally register stacks or any combination thereof—using a common universal array chip.

Figure 4:
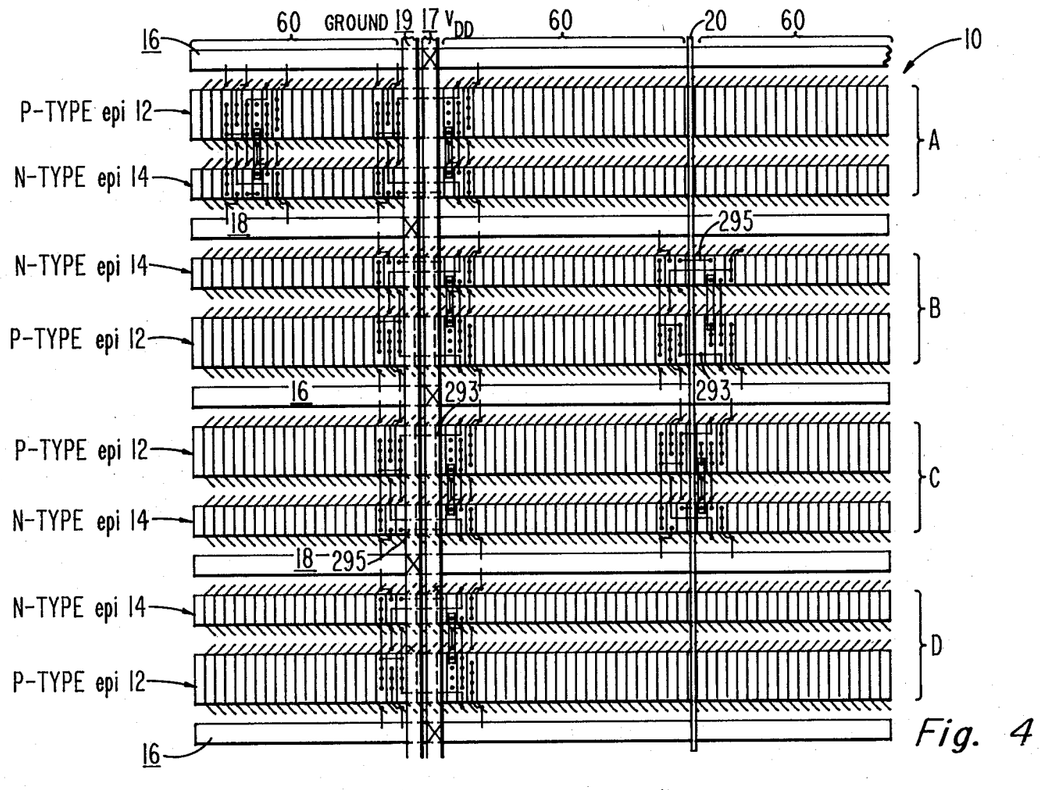
FIG. 4 illustrates a variety of ways to provide for conductors which cross cell rows and to hyphenate logic cells across such conductors.

The structure in FIG. 4 is similar to that in FIG. 1. However, the structure in FIG. 4 includes added features such as a rectangular grid power bus system including both horizontally extending metal power buses (16, 18) and vertically extending metal power buses (17, 19) crossing thereover. This structure is intended for use with two levels of (preferably metal) customized interconnections. In FIG. 4 the horizontally extending power buses 16 and 18 are the same as those in FIG. 1. They are in the lower level of metallization and are spaced from each other by an intervening cell row. Vertically extending power buses 17 ($V_{DD}$) and 19 (ground) are in the second or upper level metal and are connected to the corresponding horizontally extending bus at each point where the same type buses cross. This connection is indicated by the "X" where the same type buses cross. Vertical buses 17 and 19 are adjacent to each other. This minimizes the number of locations in which a cell row is crossed by power buses for a given number of vertical power buses. This grid of power buses provides smooth distribution of power throughout the array by allowing power to flow to a location of high power use in a spreadout manner.

In FIG. 4 the extrinsic P-type regions 12 and the extrinsic N-type regions 14 extend horizontally under the vertically extending power buses 17 and 19. Since the vertical (row-crossing) power buses are second level metal they prevent the placement of second level metal signal conductors in their locations. Thus, these row-crossing power buses segment each extrinsic region's series of uniform width transistors into groups 60.

In addition to vertical power buses 17 and 19 a vertically extending signal conductor 20 is shown in FIG. 4. This conductor like the power buses 17 and 19 crosses a number of rows in vertically aligned positions. The conductor 20 is similar to power buses 17 and 19 in that it restricts connections to transistors which underlie it. It differs from buses 17 and 19 in that it occupies only a single vertical wiring channel 52 (the two buses 17 and 19 together occupy a number of vertical signal wiring channels). The signal conductor 20 (like the power, buses 17 and 19) segments each line of transistors which it crosses into distinct groups 60 of transistors. Within a group 60, the transistors are unrestrictedly accessible for contact by both first and second level metal. In contrast, at the vertical (row-crossing) conductors (power buses or signal lines) which bound these groups, the ability to use second level metal as customizing conductors is restricted by the presence of that vertically extending row-crossing conductor which is itself second level metal and which does not include any direct contact to the underlying transistor(s) of the cross row. Presence of such restrictions is avoided in the prior art by routing row crossing conductors between complete cells. In order to be able to predefine the location of row-crossing conductors without rendering many transistors unuseable, the present invention hyphenates cells across such conductors. As a result, when available transistors cannot be used to fabricate a needed cell because there are not enough unused transistors in a given group 60, those transistors are used along with some on the other side of the row-crossing conductor which bounds that group 60 to form that cell. Fabrication of a cell from transistors on opposite sides of a row-crossing conductor is herein referred to as hyphenation because the cell is spread apart at a line within the cell to provide extra space within the hyphenated cell under the location of the row-crossing vertical conductor. This hyphenation can involve as little as the use of a single transistor (either PMOS or NMOS) in one group 60 with all the other transistors of the logic cell being in the adjacent group 60 on the other side of the intervening vertical (row-crossing) conductor. However, hyphenation usually involves several transistors on each of the sides of the vertical conductor.

The problem of unuseable transistors where individual signal conductors cross cell rows has been avoided in the prior art by placing such row crossing signal conductors between cells. That is, cell sizes and locations controlled placement of row-crossing conductors. When such crossing conductors are not vertically aligned in adjacent cell rows, (the usual situation) a horizontal conductor is placed in a horizontal wiring channel and connected to each of the two vertically-non-aligned pieces of that row-crossing conductor. Power buses running perpendicular to the length of the cell row are accommodated in the prior art by separating the whole parallel-row structure into two or more pieces which are spaced apart by perpendicular-to-the-row power buses. These breaks in the parallel row structure are often used to accommodate some perpendicular-to-the-row wiring channels for custom conductors as well as the power buses. The prior art technique of placing row-crossing conductors between complete cells minimizes the number of unused, unobstructed transistors in an IC, however, the resulting increase in horizontal connecting conductors contribute to the high horizontal wiring density near the center of the parallel-row structure of such prior art ICs. The present technique of providing vertically running signal conductors reduces the horizontal wiring density and thus reduces the number of horizontal wiring channels needed near the center of the parallel-row structure. This enables the parallel row structure to be shrunk even if it retains the prior art technique of dedicating horizontal wiring channels in anticipation of horizontal wiring demands. This control of horizontal wiring density is important in accordance with the close packing of transistor rows aspect of this invention because if one inactive transistor row or cell row is inadequate to provide the needed number of parallel-to-the-row wiring channels, then another row must be dedicated to wiring even if only a single additional wiring channel is needed.

Hyphenation increases circuit density by allowing the location of row-crossing conductors to be defined early in the customization process thereby improving wiring efficiency without causing a significant reduction in the number of cells which can be included in a cell row. This ability to use transistors which the prior art would consider unuseable (given the locations of the row-crossing conductors) becomes increasingly important as the number of such conductors is increased. Such an increase in row-crossing conductors decreases the number of transistors between adjacent pairs of row-crossing conductors. This increases the number of groups 60 in a cell row of a given length and thereby increases the number of locations in which unused transistors may be found.

Figure 5:
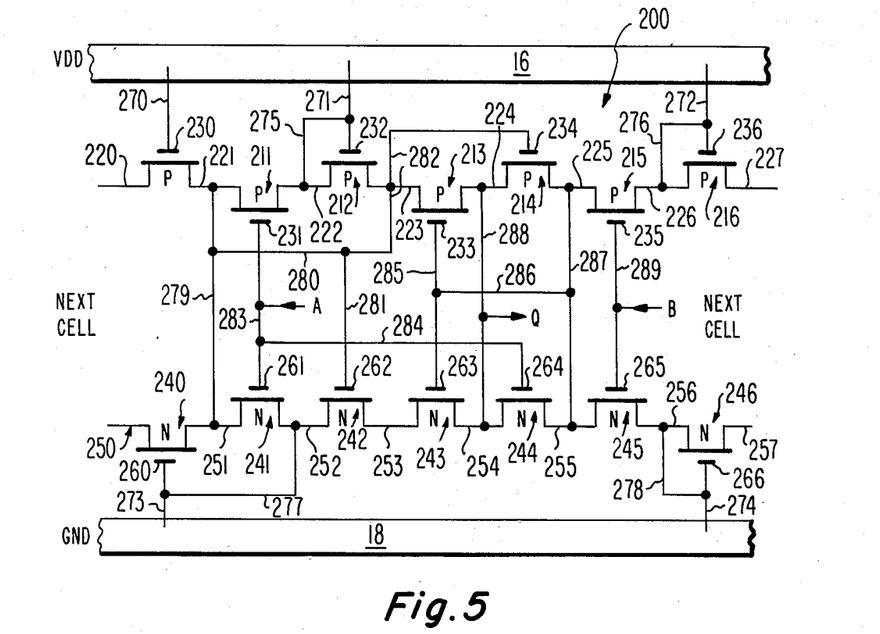
FIG. 5 is a schematic diagram of an exclusive OR circuit.

Various techniques for hyphenating cells across row-crossing conductors are illustrated in cell rows A, B, C, and D of FIG. 4. A 2-input EXCLUSIVE OR gate 200 whose schematic diagram is shown in FIG. 5 is used to illustrate the hyphenation of cells. OR gate 200 includes seven PMOS transistors 210–216, seven NMOS transistors 240–246 and their interconnecting wiring. A universal array version of OR gate 200 is illustrated schematically in FIG. 6.

Figure 6:
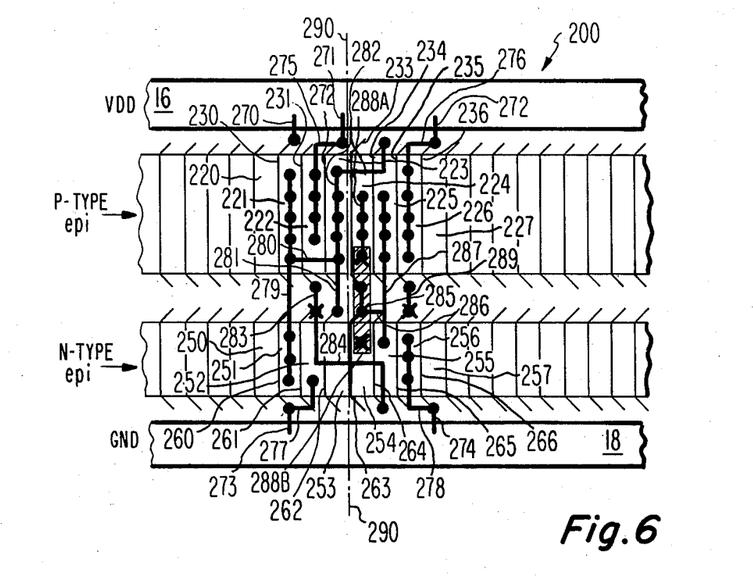
FIG. 6 is a schematic illustration of the FIG. 5 circuit in a form suitable for use in the inventive structure in FIG. 1.

The PMOS transistor 210 of FIG. 5 is embodied in FIG. 6 in the shared source/drain region 220, the shared drain region 221 and the gate electrode 230 which is connected to the $V_{DD}$ (relatively positive) power bus 16 by conductor 270. This connection of the gate electrode 230 to the $V_{DD}$ power bus holds transistor 210 in an off condition to isolate the internal components of cell 200 from adjacent-to-the-left PMOS transistqrs and their wiring. PMOS transistor 216 at the righthand side of the cell is embodied in a shared source region 226, a shared source/drain region 227 and a gate electrode 236 which is connected to the $V_{DD}$ bus by a conductor 272. The connection of the gate electrode 236 to the V$_{DD}$ bus holds transistor 216 off to provide isolation from PMOS transistors which are adjacent to the right. A conductor 276 connects the shared source region 226 to conductor 272 and thus to the V$_{DD}$ bus.

NMOS transistor 240 of FIG. 5 is embodied in a shared source/drain region 250, a shared drain region 251 and a gate electrode 260 which is connected to the ground (relatively negative) bus by conductor 273. This connection holds transistor 240 in an off condition and provides isolation between adjacent-to-the-left NMOS transistors and internal components of cell 200. NMOS transistor 246 at the righthand edge of the cell is embodied in a shared source region 256, a shared source/drain region 257 and a gate electrode 266 which is connected to the ground bus by conductor 274. This transistor serves to isolate the internal components of the cell from adjacent-to-the-right NMOS transistors and their wiring. A conductor 278 connects the source region 256 to conductor 274 and thus to ground bus 18.

PMOS transistor 211 and NMOS transistor 241 together with their wiring comprise an inverter to which the "A" input of the EXCLUSIVE OR gate is connected. PMOS transistor 211 is embodied in the shared drain region 221, a shared source region 222 and a gate electrode 231 in FIG. 6. NMOS transistor 241 is embodied in the shared source region 252, the shared drain region 251 and a gate electrode 261 in FIG. 6. The shared source region 252 is connected to the ground bus via a conductor 277 which is connected to the conductor 273. The gate electrodes 231 and 261 are interconnected by a conductor 283 to which the A input is connected. The drain regions 221 and 251 are interconnected by a conductor 279.

In a similar fashion, PMOS transistor 215 and NMOS transistor 245 together comprise an input inverter for the "B" input to the EXCLUSIVE OR gate 200. PMOS transistor 215 is embodied in the shared source region 226, a shared drain region 225, and a gate electrode 235. NMOS transistor 245 is embodied in the shared source region 256, a shared drain region 255 and a gate electrode 265. The gate electrodes 235 and 265 are interconnected by a conductor 289 to which the B input to the EXCLUSIVE OR circuit is connected. The drain regions 225 and 255 are interconnected by a conductor 287. PMOS transistor 212 comprised of the shared source region 222, a shared drain region 223 and a gate electrode 232, has its gate electrode 232 connected to the V$_{DD}$ bus by a conductor 271. This holds transistor 212 in an off condition to isolate PMOS transistor 211 to its left from the PMOS transistor 213 to its right. The source region 222 is connected to the V$_{DD}$ power bus by a conductor 275 which is connected to conductor 271. The shared drain region 223 is connected via a series connection of a conductor 282 and a conductor 280 to the conductor 279 which connects the drain regions of the transistors of the A input inverter. NMOS transistor 242 comprised of the shared source region 252, a shared drain region 253 and a gate electrode 262 has its gate electrode connected to the drain regions of the A inverter via connection of a conductor 281 between its gate electrode 262 and conductor 280.

NMOS transistor 243 is comprised of the shared drain region 253, a shared source/drain region 254 and a gate electrode 263. NMOS transistor 244 (comprised of the shared source/drain region 254, the shared drain region 255 and a gate electrode 264) completes the series connection of the NMOS transistors 240–246. The gate electrode 264 is connected via a conductor 284 to the A input conductor 283 of EXCLUSIVE OR 200.

PMOS transistor 213 is comprised of the shared drain region 223, a shared source/drain region 224 and a gate electrode 233. PMOS transistor 214 is comprised of the shared source/drain region 224, the shared drain region 225 and the gate electrode 234. Transistor 214 completes the series connection of the seven PMOS transistors 210–216. The gate electrode 234 of transistor 214 is connected via conductors 282 and 280 to the drain region 223 and to the conductor 279 which connects the drain regions of the A input inverter transistors.

The source/drain regions 224 and 254 are interconnected by a conductor 288 to which the output of EXCLUSIVE OR gate 200 is connected. In FIG. 6, the conductor 288 has two portions, 288A and 288B. Portion 288A is first level metal like the other conductors 270–289. Portion 288B (shown in hatching) is second level metal and passes over the conductors 285 and 286 without contacting them. The X's under the ends of portion 288B and on the contacts to gate electrodes 261 and 265 indicate that vias are left in the insulating layer over the first level metal at those locations to enable contact between first and second level metal. The round dots indicate contacts between the first level metal and the underlying non-customized structure (shared source/drain regions and gate electrode contact areas). A contact is also present under each of the vias (X's).

The gate electrodes 233 and 263, respectively, of PMOS transistor 213 and NMOS transistor 243 are interconnected by a conductor 285 which is connected via a conductor 286 to the conductor 287 which interconnects the drain regions 225 and 255. This controls the conductivity state of the PMOS transistor 213 and the NMOS transistor 243 in accordance with the B input to the EXCLUSIVE OR gate 200.

Together, the connection of the drain regions of the A input inverter transistors to the gate 234 of PMOS transistor 214, to drain region 223 and to the gate 262 of NMOS transistor 242 and the connection of the input conductor 283 of the A input inverter to the gate electrode 264 of NMOS transistor 244 serve to control the conductive state of the PMOS transistor 214 and NMOS transistors 242 and 244 in accordance with the A input to EXCLUSIVE OR gate 200. This interconnection of the various regions of the FIG. 6 structure serves to provide the cell 200 with an EXCLUSIVE OR truth table.

Figure 7:
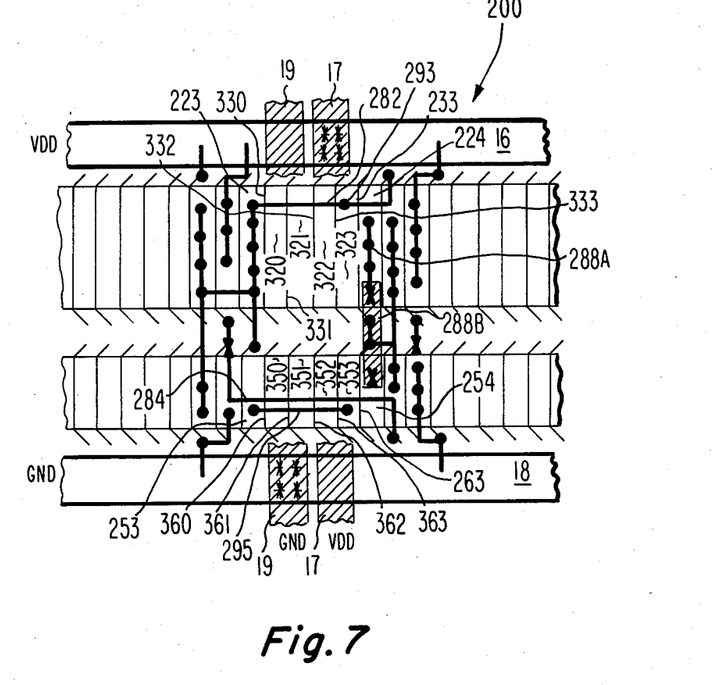
FIG. 7 illustrates a hyphenated version of the FIG. 6 cell.

A hyphenated version of the cell 200 is illustrated in FIG. 7. This cell is hyphenated along the dashed line 290 in FIG. 6 and the two pieces spread apart in order to allow the vertically running power buses 17 and 19 to pass over the cell 200 without interfering with the proper operation of that cell. The vertical power buses 17 and 19 are omitted from the central portion of FIG. 7 in order to maintain drawing clarity. As a result of the splitting or hyphenation of cell 200 four shared source/drain regions 320–323 which are not present in the non-hyphenated version of cell 200 are present in the P-type epitaxial region within cell 200 along with their associated gate electrodes 330–333. Similarly, four shared source/drain regions 350–353 which are not present in the non-hyphenated version of cell 200 are present in the N-type epitaxial region within cell 200 along with their associated gate electrodes 360–363. In both cases the extra source/drain regions and gate electrodes are under the set of buses 17 and 19. The connection points of the gate electrodes 330–333 and 360–363 are overlain by the vertical power buses 17 and 19. As a result, second level metal connections to those gate electrodes cannot be made. To ensure proper operation of EXCLUSIVE OR gate 200, a contact 293 is added between the conductor 282 and the added shared source/drain region 323 thereby making region 323 a a drain region which is functionally an electrical extension of the shared drain region 223. This serves to hyphenate the portion of the cell structure which is contained in the P-type epitaxial material across the power buses.

A conductor 295 is added with contacts to (1) the N-type drain region 253 and (2) the added shared source/drain region 353. This conductor makes the region 353 functionally an electrical extension of the drain region 253 and serves to hyphenate the portion of the cell structure which is contained in the N-type epitaxial material across the vertical buses 17 and 19. The necessity for and the location of such bridging conductors (295) and contacts (293) depends on the type of cell being hyphenated and the location within the cell of the hyphenation line at which the cell is hyphenated (split) for placement on opposing sides of the overlying vertical conductor.

The EXCLUSIVE OR gate 200 of FIG. 6 is included in IC 10 in the lefthand group 60 of uniform transistors in row A as shown in FIG. 4. IC 10 also includes a number of hyphenated versions of this OR gate as shown in FIG. 7. One of these hyphenated versions is located in row A where it is hyphenated across the vertical power bus set. In row A, the location of the vertical power buses 17 and 19 is predetermined and provided for in the non-customized structure of a chip. Gate electrodes which would have their contact areas under the power buses are omitted. The epitaxial material which underlies the power buses constitutes a shared source/drain region for the transistors whose gate electrodes are located adjacent to the opposing sides of the power bus set. This shared source/drain region is elongated compared to the shared source/drain regions 34 and 38, but directly connects the channel regions of the transistors on either side of the power bus in the same manner as the shared regions 34 and 38 connect their adjacent channel regions. In this version of the hyphenated cell the added contact 293 on conductor 282 and the additional conductor 295 and its contacts are omitted from the hyphenated cell because the omission of the gate electrodes 330-333 and 360-363 makes these additional features unnecessary.

In rows B-D of FIG. 4, the location of power buses 17 and 19 is not predefined in the non-customized structure of the IC. As a result, each of these cell rows contains a single continuous row of uniform width PMOS transistors and a single continuous row of uniform width NMOS transistors. In row B, the gate electrodes which are overlain by the power buses or by the vertical signal lines are left unconnected. Two EXCLUSIVE OR gates 200 are shown, one hyphenated across the power bus set and one hyphenated across the vertical signal line 20. In each of these locations, the hyphenated cell has the configuration shown in FIG. 7. In hyphenating across the power bus set, all four of the added source/drain regions shown in the P-type and N-type epitaxial regions of FIG. 7 are included in the hyphenated cell. However, in hyphenation across the signal line 20 only a single added source/drain region is present in each epitaxial region as is one extra gate electrode over each of the epitaxial regions. This is because the signal line 20 only obstructs connections to a single gate electrode in each epitaxial region. The bridging contact 293 and the bridging conductor 295 are included in these hyphenated cells for the reasons discussed above in connection with FIG. 7. The hyphenated cells in row B are mirror images of the configuration they would have in row A because of the reversed order of the N-type and P-type epitaxial regions in row B as compared to row A in combination with the fact that the gate electrode contact areas are offset to the right in both rows A and B.

The cell 200 which is hyphenated across the power buses in row C, is (except for being a mirror image) identical to that in row B with the exception that the overlain gate electrodes 330-333 and 360-363 are each connected to their adjacent power bus by first level conductors which are shown in phantom because of the overlying power buses. These connections serve to ensure that the overlain additional transistors remain in the off condition at all times by avoiding the possibility of a floating gate electrode accumulating enough charge to turn on the underlying transistor. This same technique is used to hyphenate the cell across the signal line 20 in row C.

This connection of the overlain gate electrode provides isolation between the shared source/drain regions on opposing sides of the vertically extending conductors in the absence of a bridging conductor interconnecting these regions. Such isolation is unnecessary in the EXCLUSIVE OR gate 200. However, such isolation may be desirable in other cell structures or in the structure of EXCLUSIVE OR gate 200 when a different hyphenation line is utilized. In the event that a cell has vertically aligned isolation transistors in both its P-type and its N-type epitaxial region, hyphenation across a single signal line can be obtained without increasing the horizontal width of that cell where the signal line overlies the gates of the isolation transistors by connection of the gate electrodes to their adjacent power buses in the above described manner.

In row D, the cell is hyphenated across the power bus set. In the hyphenation scheme illustrated in row D the overlain gate electrodes are connected to the opposing power bus to turn the overlain transistors on. This effectively combines the shared source/drain regions on either side of the vertically extending conductor into a single continuous source/drain region extending under the vertically extending conductors. This is most easily done by connecting together the gate electrodes of all of the overlain PMOS transistors and connecting those gates to the overlying vertically extending ground bus 19. In a similar manner the gate electrodes of the overlain NMOS transistors are interconnected and connected to the overlying $V_{DD}$ power bus. The X on a bus (17 or 19) over the contact portions of the gate electrodes thereunder indicates the connection of the underlying gates to that bus. The gate contact areas and interconnection conductors are shown in phantom because they underlie the power buses. In this hyphenation scheme, the additional contact 293 6 and the additional conductor 295 with its contacts (shown in FIG. 7) may be omitted since the connection of the overlain gate electrodes to the opposing power bus is used to turn on those transistors. However, this extract contact and extra conductor with its contacts may be included in the cell if desired, in order to ensure that the series connection of the several source/drain regions under the power bus set does not have a high enough resistance to adversely affect cell operation. This transistors-turnedon hyphenation scheme has its primary utility where the hyphenation line within the cell is such that there is no appropriate way in which to add an additional conductor such as 295 to bridge across the overlain transistors and to connect the shared source/drain regions on opposing sides of a power bus set.

For simplicity of the drawing no cells are hyphenated across the signal line 20 in rows A and D. If, a hyphenated cell were needed at these locations, then the hyphenation technique shown in either row B or row C could be utilized effectively. It is impractical to use the hyphenation technique shown at the power buses in Row D for signal line 20 because the conductors necessary to connect the overlain gates to opposing power buses would occupy two vertical wiring channels and would waste more space than that connection would save. This is because the signal line 20 does not bring overlying ground and $V_{DD}$ buses with it is the power bus pair does. Thus, a separate vertically running conductor crossing the opposing-type transistor row would be required to reach the opposing bus in order to connect each gate electrode to its opposing power bus.

What is claimed is:

1. A semiconductor integrated circuit (IC) comprising:
   a plurality of parallel lines of first conductivity type transistors and a plurality of parallel lines of second conductivity type transistors, each of said lines of transistors extending parallel to a first direction;
   said lines of first conductivity type transistors and said lines of second conductivity type transistors being interspersed in a second direction perpendicular to said first direction with each line of first conductivity type transistors being adjacent to at least one line of second conductivity type transistors and each line of second conductivity type transistors being adjacent to at least one line of first conductivity type transistors;
   one of said lines of first conductivity type transistors together with an adjacent one of said lines of second conductivity type transistors comprising a cell row;
   a first plurality of conductors disposed in a first layer and extending primarily parallel to said rows; and
   a second plurality of conductors disposed in a second layer and extending primarily perpendicular to said rows, said second plurality including a plurality of conductors each of which extends perpendicular to said rows and crosses at least two of said rows and is referred to as a row-crossing conductor;
   said first layer being disposed between said transistors and said second layer;
   said conductors of said first and second pluralities selectively interconnecting said transistors to provide intracell and intercell connections to provide a desired function for said IC and to create a plurality of first-type logic cells, each of which performs the same logic function and includes within its boundaries transistors within only one cell row, said plurality of first-type logic cells including both a standard version of said logic cell and a hyphenated version of said logic cell;
   said standard version of said first-type logic cell including within its boundaries a first predetermined number of said first conductivity type transistors and a second predetermined number of said second conductivity type transistors which are interconnected within said cell in a particular manner, both of said predetermined numbers being integers greater than one;
   said hyphenated version of said first-type logic cell including within its boundaries:
      said first predetermined number of said first conductivity type transistors and said second predetermined number of said second conductivity type transistors which correspond respectively, to said first conductivity type and said second conductivity type transistors in said standard version of said first-type logic cell, an extra space not present in said standard version which runs perpendicular to the cell rows and over which passes one of said row-crossing conductors,
      said predetermined numbers of said first and second conductivity type transistors of said hyphenated version being interconnected within said cell in said particular manner and being distributed with some of each type disposed on each side of said extra space.

2. The IC recited in claim 1 wherein:
   said row-crossing conductor which passes over the extra space in said hyphenated version of said first-type logic cell is a first-potential power bus and is connected to a conductor in said first plurality of conductors which is a first-potential, first-direction-extending, power bus.

3. The IC recited in claim 2 further comprising:
   a second row-crossing conductor crossing said hyphenated version of said first type logic cell in the same extra space as said first recited row-crossing conductor, said second row-crossing conductor being a second-potential power bus and being connected to a conductor in said first plurality of conductors which is a second-potential, first-direction-extending power bus; and wherein:
   said first potential is positive relative to said second potential.

4. The IC recited in claim 7 wherein:
   the location of said row-crossing conductor over said hyphenated version of said first-type logic cell would cause a short circuit between said row-crossing conductor and any other conductor in said second plurality which was directly connected to one of said additional transistors whereby said additional transistors are referred to as restricted connection transistors; and
   said IC includes:
      first-potential power buses which provide a relatively positive voltage, and
      second-potential power buses which provide a relatively negative voltage.

5. The IC recited in claim 4 wherein:
   said first conductivity type transistors are PMOS transistors and the gate electrode of each restricted connection PMOS transistor is coupled to one of said second-potential power buses; and
   said second cnductivity type transistors are NMOS transistors and the gate electrode of each restricted connection NMOS transistor is coupled to one of said first-potential power buses;
   said coupling of said gate electrodes of said restricted connection transistors to said power buses holding said restricted connection transistors ON whenever power is applied to said power buses to provide a connection between transistors of a given type which are disposed on opposite sides of said row-crossing conductor.

6. The IC recited in claim 4 wherein:
said first conductivity type transistors are PMOS transistors and the gate electrode of each restricted connection PMOS transistor is coupled to one of said first-potential power buses;
said second conductivity type transistors are NMOS transistors and the gate electrode of each restricted connection NMOS transistor is coupled to one of said second-potential power buses;
said coupling of said gate electrodes of said restricted connection transistors to said power buses holding said restricted connection transistors OFF wherever power is applied to said power buses to provide isolation between transistors of a given type which are disposed on opposite sides of said row-crossing conductor.

7. A semiconductor integrated circuit (IC) comprising:
a plurality of parallel lines of first conductivity type transistors and a plurality of parallel lines of second conductivity type transistors, each of said lines of transistors extending parallel to a first direction;
said lines of first conductivity type transistors and said lines of second conductivity type transistors being interspersed in a second direction perpendicular to said first direction with each line of first conductivity type transistors being adjacent to at least one line of second conductivity type transistors and each line of second conductivity type transistors being adjacent to at least one line of first conductivity type transistors;
one of said lines of first conductivity type transistors together with an adjacent one of said lines of second conductivity type transistors comprising a cell row;
a first plurality of conductors disposed in a first layer and extending primarily parallel to said rows; and
a second plurality of conductors disposed in a second layer and extending primarily perpendicular to said rows, said second plurality including a plurality of conductors each of which extends perpendicular to said rows and crosses at least two of said rows and is refered to as a row crossing conductor;
said first layer being disposed between said transistors and said second layer;
said conductors of said first and second pluralities selectively interconnecting said transistors to provide intracell and intercell connections to provide a desired function for said IC and to create a plurality of first-type logic cells, each of which performs the same logic function and includes within its boundaries transistors within only one cell row, said plurality of first-type logic cells including both a standard version of said logic cell and a hyphenated version of said logic cell;
said standard version of said first-type logic cell including within its boundaries a first predetermined number of said first conductivity type transistors and a second predetermined number of said second conductivity type transistors which are interconnected within said cell in a particular manner, both of said predetermined numbers being integers greater than one;
said hyphenated version of said first-type logic cell including within its boundaries:
said first predetermined number of said first conductivity type transistors and said second predetermined number of said second conductivity type transistors which correspond respectively, to said first conductivity type and said second conductivity type transistors in said standard version of said first-type logic cell, an extra space not present in said standard version which runs perpendicular to the cell rows and over which passes one of said row-crossing conductors,
said predetermined numbers of said first and second conductivity type transistors of said hyphenated version being interconnected within said cell in said particular manner and being distributed with some of each type disposed on each side of said extra space; and
said hyphenated version of said first-type logic cell including at least one first conductivity type transistor and at least one second conductivity type transistor each of which is disposed in said extra space and at least partially underneath said row-crossing conductor and which has no corresponding transistor is said standard version of said first-type logic cell and which is referred to as an additional transistor, said additional transistor of said first conductivity type being in addition to said first predetermined number which are present in said standard version of said first-type logic cell and said additional transistor of said second conductivity type being in addition to said second predetermined number which are present in said standard version of said first-type logic cell.

8. The IC recited in claim 7 wherein said hyphenated version of said first-type logic cell further comprises:
at least one conductor in said first plurality which has no corresponding conductor in said standard version of said first-type logic cell and which connects one of said transistors of said hyphenated version of said first-type logic cell which is on one side of said extra space to one of said transistors of said hyphenated version of said first-type logic cell which is on the other side of said extra space.

9. The IC recited in claim 6 wherein said hyphenated version of said first-type logic cell further comprises:
at least one conductor in said first plurality which has no corresponding conductor in said standard version of said first-type logic cell and which connects one of said transistors of said hyphenated version of said first-type logic cell which is on one side of said extra space to one of said transistors of said hyphenated cell which is on the other side of said extra space.

* * * * *